(12) United States Patent
Rana

(10) Patent No.: US 10,127,990 B1
(45) Date of Patent: Nov. 13, 2018

(54) NON-VOLATILE MEMORY (NVM) WITH DUMMY ROWS SUPPORTING MEMORY OPERATIONS

(71) Applicant: STMicroelectronics International N.V., Schiphol (NL)

(72) Inventor: Vikas Rana, Noida (IN)

(73) Assignee: STMicroelectronics International N.V., Schiphol (NL)

( * ) Notice: Subject to any disclaimer, the term of this patent is extended or adjusted under 35 U.S.C. 154(b) by 0 days.

(21) Appl. No.: 15/652,564

(22) Filed: Jul. 18, 2017

(51) Int. Cl.
  *G11C 16/06* (2006.01)
  *G11C 16/28* (2006.01)
  *G11C 16/14* (2006.01)
  *G11C 16/08* (2006.01)

(52) U.S. Cl.
  CPC .............. *G11C 16/28* (2013.01); *G11C 16/08* (2013.01); *G11C 16/14* (2013.01)

(58) Field of Classification Search
  CPC .............. G11C 11/1675; G11C 11/405; G11C 11/4076; G11C 11/5607; G11C 15/02; G11C 15/046; G11C 16/04; G11C 16/0483; G11C 16/26; G11C 2211/4016; G11C 8/04; G11C 8/12; G11C 11/5642; G11C 16/0408; G11C 16/0466; G11C 16/10

USPC .......... 365/185.18, 189.011, 189.15, 230.03, 365/185.2, 189.16, 210.1, 158, 185.03, 365/185.05, 185.12, 185.17, 185.23, 365/185.24, 210.15, 72
See application file for complete search history.

(56) References Cited

U.S. PATENT DOCUMENTS

2005/0213363 A1* 9/2005 Oga ....................... G11C 29/02
  365/145

* cited by examiner

*Primary Examiner* — Thong Q Le
(74) *Attorney, Agent, or Firm* — Crowe & Dunlevy

(57) ABSTRACT

A memory array includes rows and columns with memory cell portion and a dummy cell portion. Bit lines are connected to the memory cells and to the dummy cell portion. The dummy cell portion includes a first row of dummy cells and a second row of dummy cells. The dummy cells in the first row have a first connection to a corresponding bit line of a first bit line group of the bit lines and a second connection to a first source line. The dummy cells in the second row have a first connection to a corresponding bit line of a second bit line group of the plurality of bit lines and a second connection to a second source line. The dummy cells are selectively actuated to couple voltages at the first and second source lines to the first and second bit line groups, respectively, depending on memory operating mode.

31 Claims, 4 Drawing Sheets

NON-VOLATILE MEMORY (NVM) WITH DUMMY ROWS SUPPORTING MEMORY OPERATIONS

TECHNICAL FIELD

The present invention relates to a Non-Volatile Memory (NVM) and, more particularly, to the use of dummy rows of memory cells to support memory operations within a NVM.

BACKGROUND

Reference is now made to FIG. 1 showing a block diagram of a conventional Non-Volatile Memory (NVM) 100. The memory 100 includes a plurality of NVM cells 102 arranged in a memory array 104 including a plurality of rows 106 and a plurality of columns 108.

FIG. 2 shows a circuit diagram of an example NVM cell 102. This circuit is only one example of a NVM cell and it will be understood that other NVM cell circuit configurations could be used. The NVM cell 102 is formed by the series connection of the source-drain paths of an n-channel MOSFET select transistor 116 and an n-channel MOSFET floating gate transistor 118. The NVM cell 102 includes a bit line (BL) terminal 120 coupled to a first end of the series connected source-drain paths (at the drain of the floating gate transistor 118) and a source line (SL) terminal 122 coupled to a second end of the series connected source-drain paths (at the source of the select transistor 116). The gate of the select transistor 116 is coupled to a select line (Sel) terminal 124 of the NVM cell 102 while the top gate of the floating gate transistor 118 is connected to a row word line (WL) with the included floating gate left floating because this terminal is isolated with oxide from both sides.

In a first column 108 of the array, the NVM cells 102 in that column 108 have their source line terminals 122 connected together to a source line 112 of the array and their bit line terminals 120 connected together to a first bit line 110 of the array. In a second column 108 of the array, the NVM cells 102 in that column 108 have their source line terminals 122 connected together to the first bit line 110 of the array and their bit line terminals 120 connected together to a second bit line 110 of the array. Thus, the first bit line 110 of the array acts as the bit line for the NVM cells 102 of the first column 108 and the source line for the NVM cells 102 of the second column depending on configuration set by operation of the column decoder. This arrangement repeats itself across the array until the last column 108 where the NVM cells 102 in that column 108 have their source line terminals 122 connected together to the next-to-last bit line 110 of the array and their bit line terminals 120 connected together to the last bit line 110 of the array.

In this configuration, odd numbered ones of the NVM cells 102 in a given row (for example, NVM cells 102(1) and 102(3)) have their select line terminals 124 connected to a first select line 126(1) for the row 106, while even numbered ones of the NVM cells 102 in that given row (for example, NVM cells 102(2) and 102(n)) have their select line terminals 124 connected to a second select line 126(2) for that same row 106.

The select lines 126 are driven by a row decoder circuit which provides the word lines (not explicitly shown). The source line 112 and bit lines 110 are connected to a column decoder circuit for column selection and sensing by a sense amplifier circuit. The column decoder circuit controls whether a given bit line 110 functions in a bit line mode or a source line mode with respect to a certain column of NVM cells. The column decoder circuit further controls the connection of the source line 112 to ground to support memory array operations.

SUMMARY

In an embodiment, a memory comprises: a memory array including a plurality of rows and columns, the memory array including a memory portion including memory cells and a dummy portion including dummy cells; a plurality of bit lines, one bit line for each column of the memory array, each bit line connected to the memory cells within the column; wherein the dummy portion comprises: a first row of dummy cells, wherein dummy cells in the first row have a first connection to a corresponding bit line of a first bit line group of the plurality of bit lines and a second connection to a first source line; and a second row of dummy cells, wherein dummy cells in the second row have a first connection to a corresponding bit line of a second bit line group of the plurality of bit lines and a second connection to a second source line.

In an embodiment, a memory comprises: a memory array including a plurality of rows and columns, the memory array including a memory portion including memory cells and a dummy portion including dummy cells; a plurality of bit lines, one bit line for each column of the memory array, each bit line connected to the memory cells within the column and to the dummy portion; a column decoder configured to selectively connect a first bit line group of the plurality of bit lines for reading from a first group of memory cells connected to bit lines of the first bit line group; and a control circuit configured to selectively actuate dummy cells within the dummy portion of the memory array to connect a second bit line group of the plurality of bit lines to a read reference voltage for application of the read reference voltage to the first group of memory cells through the second bit line group of the plurality of bit lines.

In an embodiment, a memory comprises: a memory array including a plurality of rows and columns, the memory array including a memory portion including memory cells and a dummy portion including dummy cells; a plurality of bit lines, one bit line for each column of the memory array, each bit line connected to the memory cells within the column and to the dummy portion; a column decoder configured to selectively disconnect the plurality of bit lines from column decoding signals; and a control circuit configured to selectively actuate dummy cells within the dummy portion of the memory array to connect the plurality of bit lines to a soft programming reference voltage for application of the soft programming reference voltage to the memory cells of the memory portion of the memory array.

In an embodiment, a memory comprises: a memory array including a plurality of rows and columns, the memory array including a memory portion including memory cells and a dummy portion including dummy cells; a plurality of bit lines, one bit line for each column of the memory array, each bit line connected to the memory cells within the column and to the dummy portion; a column decoder configured to selectively disconnect a first bit line group of the plurality of bit lines and a second bit line group of the plurality of bit lines from column decoding signals; and a control circuit configured to selectively actuate dummy cells within the dummy portion of the memory array to: connect the first bit line group of the plurality of bit lines to a first programming voltage for application of the first programming voltage to a first group of memory cells connected to the first bit line group of the plurality of bit lines; and connect the second bit line group of the plurality of bit lines to a second programming voltage, different from the first programming voltage, for application of the second programming voltage to a second group of memory cells connected to the second bit line group of the plurality of bit lines.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 3:
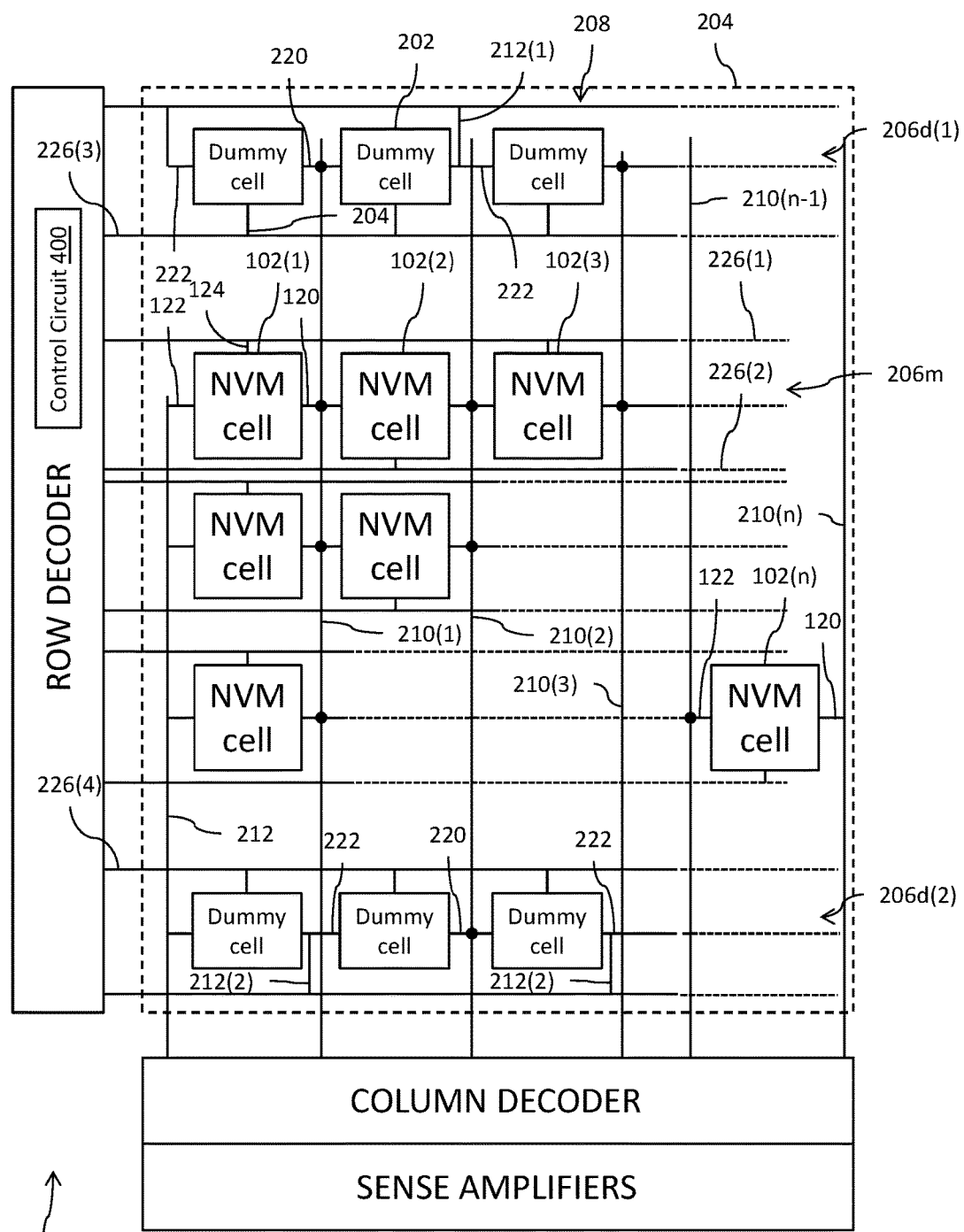
FIG. 3 shows a block diagram of a NVM with dummy rows.

Reference is made to FIG. 3 showing a block diagram of a Non-Volatile Memory (NVM) 200. The memory 200 includes a plurality of memory cells arranged in a memory array 204 including a plurality of rows 206 and a plurality of columns 208. The plurality of rows 206 include memory rows 206m and dummy rows 206d. The memory rows 206m include NVM cells 102 and the dummy rows 206d include dummy cells 202.

Figure 1:
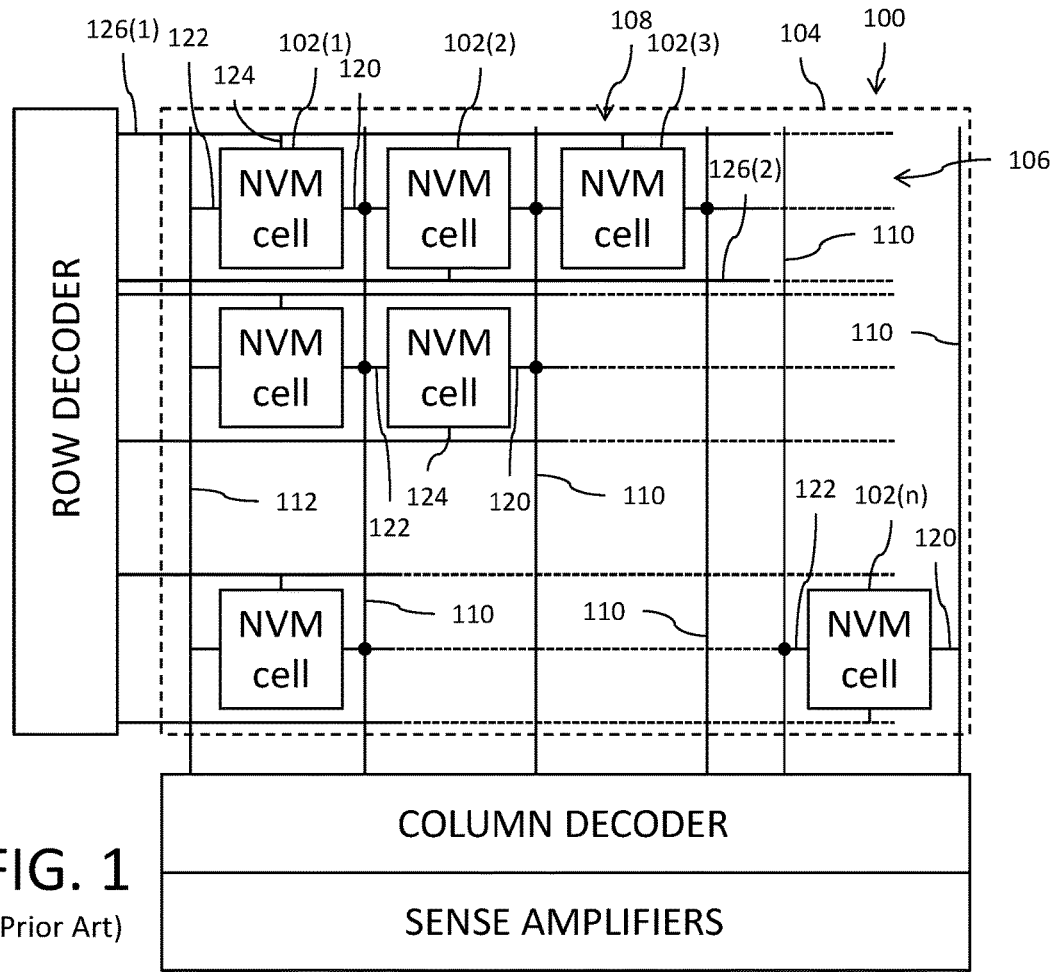
FIG. 1 shows a block diagram of a prior art Non-Volatile Memory (NVM)
Figure 2:
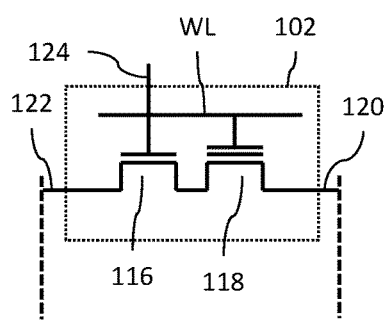
FIG. 2 shows a circuit diagram of a prior art NVM cell for use in the memory of FIG. 1.
Figure 4:
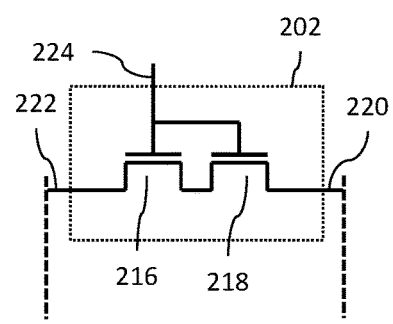
FIG. 4 shows a circuit diagram of a dummy cell for use in the memory of FIG. 3.

The NVM cells 102 may, for example, have the circuit configuration as shown in FIG. 2 and described herein. This circuit is only one example of NVM cell and it will be understood that other NVM cell circuit configurations could be used. FIG. 4 shows a circuit diagram of an example dummy cell 202. This circuit is only one example of a dummy cell and it will be understood that other dummy cell circuit configurations could be used. The dummy cell 202 is formed by the series connection of the source-drain paths of two n-channel MOSFET transistors 216 and 218. The dummy cell 202 includes a bit line (BL) terminal 220 coupled to a first end of the series connected source-drain paths (at the drain of the transistor 218) and a source line (SL) terminal 222 coupled to a second end of the series connected source-drain paths (at the source of the transistor 216). The gates of the transistors 216 and 218 are coupled to a select line (Sel) terminal 224 of the dummy cell 202.

The transistors 116 and 216 are similar to each other in size and construction. The transistors 118 and 218 are likewise similar to each other in size, but transistor 118 is instead made with a floating gate terminal.

With respect to the portion of the array 204 including the memory rows 206m, in a first column 208 of the array, the NVM cells 102 in that column 108 have their source line terminals 122 connected together to a source line 212 of the array and their bit line terminals 120 connected together to a first bit line 210(1) of the array. In a second column 208 of the array, the NVM cells 102 in that column 208 have their source line terminals 122 connected together to the first bit line 210(1) of the array and their bit line terminals 120 connected together to a second bit line 210(2) of the array.

Thus, the first bit line 210(1) of the array acts as the bit line for the NVM cells 102 of the first column 208 and the source line for the NVM cells 102 of the second column. This arrangement repeats itself across the array until the last column 208 where the NVM cells 102 in that column 208 have their source line terminals 122 connected together to the next-to-last bit line 210(n-1) of the array and their bit line terminals 120 connected together to the last bit line 210(n) of the array. For the plurality of NVM cells 102 in each memory row 206m, odd numbered ones of the NVM cells 102 (for example, cells 102(1), 102(3), etc.) in the row 206m have their select line terminals 124 connected to a first select line 226(1) for the row 206m. Even numbered ones of the NVM cells 102 (for example, cells 102(2), 102(n), etc.) in the row 206m have their select line terminals 124 connected to a second select line 226(2) for the row 206m.

Turning next to the portion of the array 204 including dummy rows 206d, each dummy row 206d includes a plurality of pairs of dummy cells 202, where two adjacent dummy cells 202 in a pair of dummy cells share a common bit line 210 through connections to the corresponding bit line terminals 220 and adjacent pairs of dummy cells share a common source line 212 through connections to the corresponding source line terminals 222. In a first one of the dummy rows 206d(1), also referred to as the top dummy row, the source line connections are made to a first controllable source line 212(1), the bit line connections are made to odd numbered ones of the bit lines 210 (for example, 210(1) and 210(3)), and each dummy cell 202 has its select line terminal 124 connected to a third select line 226(3). In a second one of the dummy rows 206d(2), also referred to as the bottom dummy row, the source line connections are made to a second controllable source line 212(2), the bit line connections are made to even numbered ones of the bit lines 210 (for example, 210(2) and 210(n)), and each dummy cell 202 has its select line terminal 124 connected to a fourth select line 226(4).

Although FIG. 3 shows the two dummy rows located above and below, respectively, the portion of the array 204 including the memory rows 206m, it will be understood that this is just one option for placing the dummy rows. Alternatively, all dummy rows could be arranged adjacent to each other.

Operation of the memory of FIG. 3 for a read is as follows:

The row decoder decodes an address and selects one of the memory rows 206m responsive to that address. The address decoding operation further enables, through the operation of control circuit 400, either the first select line 226(1) or the second select line 226(2) for the selected one of the memory rows 206m. This in effect chooses whether it is the odd numbered ones of the NVM cells 102 (for example, cells 102(1), 102(3), etc.) in the selected row 206m which are being accessed (when the first select line 226(1) is enabled) or it is the even numbered ones of the NVM cells 102 (for example, cells 102(2), 102(n), etc.) in the selected row 206m which are being accessed (when the second select line 226(2) is enabled).

Assume for a moment that the first select line 226(1) is enabled and the odd numbered ones of the NVM cells 102 in the selected row 206m are being accessed. The column decoder also decodes the address and selects the odd numbered ones of the bit lines 210 (for example, 210(1) and 210(3)) for connection to the sense amplifier. In order to perform a correct read operation on the odd numbered ones of the NVM cells 102, the even numbered ones of the bit lines 210 (for example, 210(2) and 210(n)) must be controlled as source lines and connected to ground. This is accomplished through the operation of the dummy cells 202 of the second dummy row 206*d*(2). The fourth select line 226(4) is actuated, by the control circuit 400, in response to the enabling of the first select line 226(1) which turns on the transistors in each dummy cell 202 of the second dummy row 206*d*(2) to electrically connect the even numbered ones of the bit lines 210 to the second controllable source line 212(2). This second controllable source line 212(2) is connected by the control circuit 400 to ground in response to operation of the memory in read mode.

Now instead assume the second select line 226(2) is enabled and the even numbered ones of the NVM cells 102 in the selected row 206*m* are being accessed. The column decoder also decodes the address and selects the even numbered ones of the bit lines 210 (for example, 210(2) and 210(*n*)) for connection to the sense amplifier. In order to perform a correct read operation on the even numbered ones of the NVM cells 102, the odd numbered ones of the bit lines 210 (for example, 210(1) and 210(3)) must be configured as source lines and connected to ground. This is accomplished through the operation of the dummy cells 202 of the first dummy row 206*d*(1). The third select line 226(3) is actuated, by the control circuit 400, in response to the enabling of the second select line 226(2) which turns on the transistors in each dummy cell 202 of the first dummy row 206*d*(1) to electrically connect the odd numbered ones of the bit lines 210 to the first controllable source line 212(1). This first controllable source line 212(1) is connected by the control circuit 400 to ground in response to operation of the memory in read mode.

Operation of the memory for a soft programming is as follows:

A soft programming of the memory is accomplished by driving all bit lines (odd and even) 210 to ground. The first and second select lines 226(1) and 226(2) for all memory rows 206*m* of the memory are disabled (i.e., driven to ground) by the control circuit 400. The third and fourth select lines 226(3) and 226(4) for the dummy rows 206*d* are enabled by the control circuit which turns on the transistors in each dummy cell 202 so as to electrically connect the odd numbered ones of the bit lines 210 to the first controllable source line 212(1) and to electrically connect the even numbered ones of the bit lines 210 to the second controllable source line 212(2). The first and second controllable source lines 212(1) and 212(2) are both connected by the control circuit 400 to ground in response to operation of the memory in soft programming mode. With all bit lines now connected to ground through the enabled dummy cells 202, soft programming can be performed by driving the gates of the memory cells to a high voltage sufficient to cause soft programming. At the same time, the column decoder is disabled so that the bit lines 210 do not interact with column decoding signals.

In other memory operations the voltage on the first and second controllable source lines 212(1) and 212(2) may be controlled by the control circuit 400 to voltage levels other than ground (for example, to a fraction of an inhibit voltage in a hard or pattern programming operation) and may also be left in a floating condition (for example, to a fraction of an erase voltage in an erase operation). Details concerning such memory operations are discussed herein in connection with FIG. 5.

Figure 5:
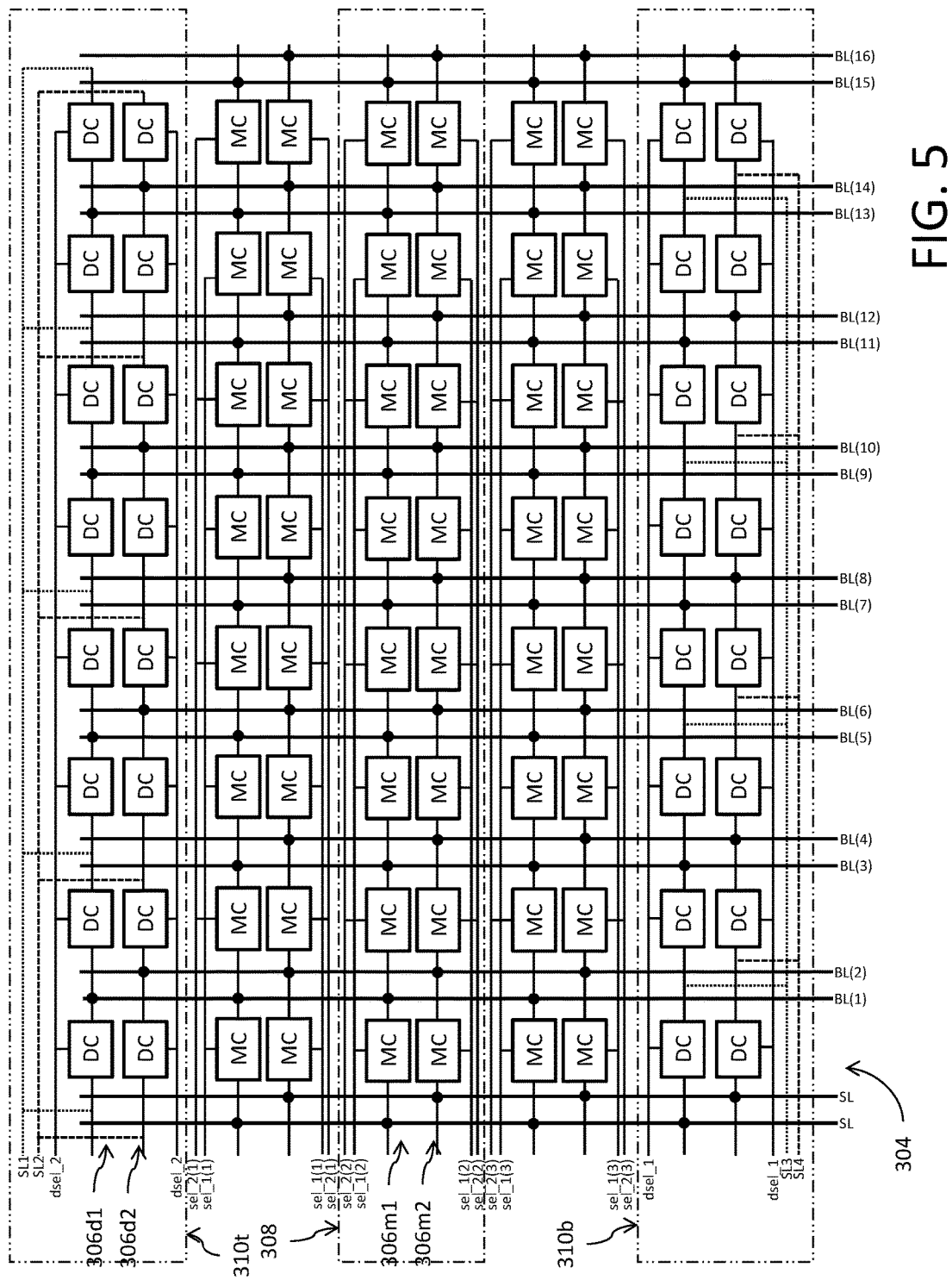
FIG. 5 shows a block diagram of a NVM array arranged with sectors.

Reference is now made to FIG. 5 showing a Non-Volatile Memory (NVM) array 304 that includes a plurality of memory cells (MC) and a plurality of dummy cells (DC). The memory cells MC may, for example, be of the same type as the memory cells 102 described herein, and the dummy cells DC may be of the same type as the dummy cells 202 described herein. The illustration of FIG. 5 focuses on the structure and configuration of the array 304 itself and omits specific illustration of other components of the NVM such as the row decoder, column decoder, control circuit and sense amplifiers. It will be understood that the array 304 may be used in connection with such NVM components configured and connected in a manner like that shown with array 204 of FIG. 3.

The array 304 includes a plurality of memory sectors 308 (three such sectors are shown in this example) and a plurality of dummy sectors 310 (two such sectors are shown in this example). Each memory sector 308 is formed by a plurality of memory rows 306*m* (two such memory rows per memory sector are shown in this example), wherein each memory row 306*m* includes a plurality of memory cells MC. Each dummy sector 310 is formed by a plurality of dummy rows 306*d* (two such dummy rows per memory sector are shown in this example), wherein each dummy row 306*d* includes a plurality of dummy cells DC.

With respect to the portion of the array 304 including the memory sectors 308, and in particular with respect to each memory row 306*m*, each memory cell MC in a column has its source line terminal 122 connected to one bit line BL of the array and its bit line terminal 120 connected to another bit line BL of the array. The left-most memory cell MC has its source line terminal 122 connected to a source line SL. In the illustrated example with two memory rows 306*m* per memory sector 308, the plurality of memory cells MC in a first (or upper) memory row 306*m*1 of the sector are connected between odd numbered bit lines (for example, bit lines BL(1), BL(3), BL(5), etc.), while the plurality of memory cells MC in a second (or lower) memory row 306*m*2 of the sector are connected between even numbered bit lines (for example, bit lines BL(2), BL(4), BL(6), etc.). Odd numbered ones of the memory cells MC in each of the first (or upper) and second (or lower) memory rows 306*m*1 and 306*m*2 of the sector 308 have their select line terminals 124 connected to a first select line sel_1(*x*), and even numbered ones of the memory cells MC in each of the first (or upper) and second (or lower) memory rows 306*m*1 and 306*m*2 of the sector 308 have their select line terminals 124 connected to a second select line sel_2(*x*), where "x" identifies the memory sector number.

Turning next to the portion of the array 304 including the dummy sectors 310, each dummy row 306*d* includes a plurality of pairs of dummy cells DC, where two adjacent dummy cells DC in a pair of dummy cells share a common bit line BL through connections to the corresponding bit line terminals 220 and adjacent pairs of dummy cells share a common source line through connections to the corresponding source line terminals 222. In the illustrated example with two dummy rows 306*d* per dummy sector 310, and specifically with respect to a first (or top) dummy sector 310*t*, the pairs of dummy cells DC in a first (or upper) dummy row 306*d*1 of the sector 310 are connected to first alternate odd numbered bit lines (for example, bit lines BL(1), BL(5), BL(9), etc.), while the pairs of dummy cells DC in a second (or lower) dummy row 306*d*2 of the sector 310 are connected to first alternate even numbered bit lines (for example, bit lines BL(2), BL(6), BL(10), etc.). With respect to a second (or bottom) dummy sector 310*b*, the pairs of dummy cells DC in the first (or upper) dummy row 306*d*1 of the sector 310 are connected to second alternate odd numbered bit lines (for example, bit lines BL(3), BL(7), BL(11), etc.), while the pairs of dummy cells DC in the second (or lower) dummy row 306d2 of the sector are connected to second alternate even numbered bit lines (for example, bit lines BL(4), BL(8), BL(12), etc.). The left-most dummy cells DC in the second (or bottom) dummy sector 310b have their bit line terminals coupled to the source lines SL.

Further to the illustrated example with two dummy rows 306d per dummy sector, the shared source terminals for adjacent pairs of dummy cells in the first (or upper) dummy row 306d1 of the sector 310 are each connected to a controllable source line (specifically: the first source line SL1 in the first (or top) dummy sector 310t and the third source line SL3 in the second (or bottom) dummy sector 310b), while the shared source terminals for adjacent pairs of dummy cells in a second (or lower) dummy row 306d2 of the sector 310 are each connected to a controllable source line (specifically: the second source line SL2 in the first (or top) dummy sector 310t and the fourth source line SL4 in the second (or bottom) dummy sector 310b). The left-most dummy cells DC in the first (or top) dummy sector 310t have their source line terminals coupled, respectively, to the first and second controllable source lines SL1 and SL2.

Lastly, the select line terminals 124 for all dummy cells DC in the dummy rows 306d1 and 306d2 of the second (or bottom) dummy sector 310b are connected to a first dummy select line dsel_1 and the select line terminals 124 for all dummy cells DC in the dummy rows 306d1 and 306d2 of the first (or top) dummy sector 310t are connected to a second dummy select line dsel_2.

Operation of the memory array 304 in connection with a read from the NVM is as follows:

The row decoder decodes an address and selects one of the memory sectors 308 responsive to that address. The column decoder further decodes the address and selects one set of alternate numbered bit lines for connection through the column decoder to the sense amplifiers, thus effectively choosing one of the memory rows 306m within the addressed sector 308. The address decoding operation further enables, using the control circuit 400, one of the select lines sel_1 or sel_2 to choose between odd and even memory cells MC of the selected row 306m.

Assume for a moment that the address decoding results in the selection of a particular one of the memory sectors 308 and the odd numbered memory cells of the second memory row 306m2. The column decoder would then select the first alternate even numbered bit lines (for example, bit lines BL(2), BL(6), BL(10), etc.) for connection through the column decoder to the sense amplifiers. The first select line sel_1(x) is enabled by the control circuit 400 to actuate the odd memory cells MC in the selected memory sector 308. In order to perform a correct read operation on the odd memory cells MC in the second memory row 306m2 of the selected memory sector 308, the second alternate even numbered bit lines (for example, bit lines BL(4), BL(8), BL(12), etc.) must be configured as source lines and connected to ground. This is accomplished through the operation of the dummy cells 202 within the dummy rows 306d of the second (or bottom) dummy sector 310b. The enabling of first select line sel_1(x) also causes the first dummy select line dsel_1 to be enabled by the control circuit 400 which turns on the transistors in each dummy cell 202 within the dummy rows 306d of the second (or bottom) dummy sector 310b. The dummy cells 202 electrically connect the second alternate even numbered bit lines (for example, bit lines BL(4), BL(8), BL(12), etc.) to the fourth source line SL4 in the second (or bottom) dummy sector 310b. This fourth source line SL4 is connected by the control circuit 400 to ground in response to operation of the memory in read mode.

It will be noted that the enabling of the transistors in each dummy cell 202 within the dummy rows 306d of the second (or bottom) dummy sector 310b further electrically connects the second alternate odd numbered bit lines (for example, bit lines BL(3), BL(7), BL(11), etc.) to the third source line SL3 in the second (or bottom) dummy sector 310b. This third source line SL3 is also connected by the control circuit 400 to ground in response to operation of the memory in read mode.

The data from the odd numbered memory cells of the second memory row 306m2 of the selected memory sector 308 is then read out from the array 304 over the first alternate even numbered bit lines BL(2), BL(6), BL(10), etc. for detection by the sense amplifiers.

Assume now that the address decoding results in the selection of a particular one of the memory sectors 308 and the odd numbered memory cells of the first memory row 306m1. The column decoder would then select the first alternate odd numbered bit lines (for example, bit lines BL(1), BL(5), BL(9), etc.) for connection through the column decoder to the sense amplifiers. The first select line sel_1(x) is enabled by the control circuit 400 to actuate the odd memory cells MC in the selected memory sector 308. In order to perform a correct read operation on the odd memory cells MC in the first memory row 306m1 of the selected memory sector 308, the second alternate odd numbered bit lines (for example, bit lines BL(3), BL(7), BL(11), etc.) must be configured as source lines and connected to ground. This is accomplished through the operation of the dummy cells 202 within the dummy rows 306d of the second (or bottom) dummy sector 310b. The enabling of first select line sel_1(x) also causes the first dummy select line dsel_1 to be enabled by the control circuit 400 which turns on the transistors in each dummy cell 202 within the dummy rows 306d of the second (or bottom) dummy sector 310b. The dummy cells 202 electrically connect the second alternate odd numbered bit lines (for example, bit lines BL(3), BL(7), BL(11), etc.) to the third source line SL3 in the second (or bottom) dummy sector 310b. This third source line SL3 is also connected by the control circuit 400 to ground in response to operation of the memory in read mode.

It will be noted that the enabling of the transistors in each dummy cell 202 within the dummy rows 306d of the second (or bottom) dummy sector 310b further electrically connects the second alternate even numbered bit lines (for example, bit lines BL(4), BL(8), BL(12), etc.) to the fourth source line SL4 in the second (or bottom) dummy sector 310b. This fourth source line SL3 is connected by the control circuit 400 to ground in response to operation of the memory in read mode.

The data from the odd numbered memory cells of the first memory row 306m1 of the selected memory sector 308 is then read out from the array 304 over the first alternate odd numbered bit lines BL(1), BL(5), BL(9), etc. for detection by the sense amplifiers.

A similar process to that described above is performed when the address decoding results in the selection of the even numbered memory cells. Specifically consider the following:

Assume for a moment that the address decoding results in the selection of a particular one of the memory sectors 308 and the even numbered memory cells of the second memory row 306m2. The column decoder would then select the second alternate even numbered bit lines (for example, bit lines BL(4), BL(8), BL(12), etc.) for connection through the column decoder to the sense amplifiers. The second select line sel_2(x) is enabled by the control circuit 400 to actuate the even memory cells MC in the selected memory sector 308. In order to perform a correct read operation on the even memory cells MC in the second memory row 306m2 of the selected memory sector 308, the first alternate even numbered bit lines (for example, bit lines BL(2), BL(6), BL(10), etc.) must be configured as source lines and connected to ground. This is accomplished through the operation of the dummy cells 202 within the dummy rows 306d of the first (or top) dummy sector 310t. The enabling of second select line sel_2(x) also causes the second dummy select line dsel_2 to be enabled by the control circuit 400 which turns on the transistors in each dummy cell 202 within the dummy rows 306d of the first (or top) dummy sector 310t. The dummy cells 202 electrically connect the first alternate even numbered bit lines (for example, bit lines BL(2), BL(6), BL(10), etc.) to the first source line SL1 in the first (or top) dummy sector 310t. This first source line SL1 is connected by the control circuit 400 to ground in response to operation of the memory in read mode.

It will be noted that the enabling of the transistors in each dummy cell 202 within the dummy rows 306d of the first (or top) dummy sector 310t further electrically connects the first alternate odd numbered bit lines (for example, bit lines BL(1), BL(5), BL(9), etc.) to the second source line SL2 in the first (or top) dummy sector 310t. This second source line SL2 is also connected by the control circuit to ground in response to operation of the memory in read mode.

The data from the even numbered memory cells of the second memory row 306m2 of the selected memory sector 308 is then read out from the array 304 over the second alternate even numbered bit lines BL(4), BL(8), BL(12), etc. for detection by the sense amplifiers.

Assume now that the address decoding results in the selection of a particular one of the memory sectors 308 with the even numbered memory cells of the first memory row 306m1. The column decoder would then select the second alternate odd numbered bit lines (for example, bit lines BL(3), BL(7), BL(11), etc.) for connection through the column decoder to the sense amplifiers. The second select line sel_2(x) is enabled by the control circuit 400 to actuate the even memory cells MC in the selected memory sector 308. In order to perform a correct read operation on the even memory cells MC in the first memory row 306m1 of the selected memory sector 308, the first alternate odd numbered bit lines (for example, bit lines BL(1), BL(5), BL(9), etc.) must be configured as source lines and connected to ground. This is accomplished through the operation of the dummy cells 202 within the dummy rows 306d of the first (or top) dummy sector 310t. The enabling of second select line sel_2(x) also causes the second dummy select line dsel_2 to be enabled by the control circuit 400 which turns on the transistors in each dummy cell 202 within the dummy rows 306d of the first (or top) dummy sector 310t. The dummy cells 202 electrically connect the first alternate odd numbered bit lines (for example, bit lines BL(1), BL(5), BL(9), etc.) to the first source line SL1 in the first (or top) dummy sector 310t. This first source line SL1 is also connected by the control circuit to ground in response to operation of the memory in read mode.

It will be noted that the enabling of the transistors in each dummy cell 202 within the dummy rows 306d of the first (or top) dummy sector 310t further electrically connects the first alternate even numbered bit lines (for example, bit lines BL(2), BL(6), BL(10), etc.) to the second source line SL2 in the first (or top) dummy sector 310t. This second source line SL2 is connected by the control circuit 400 to ground in response to operation of the memory in read mode.

The data from the even numbered memory cells of the first memory row 306m1 of the selected memory sector 308 is then read out from the array 304 over the second alternate odd numbered bit lines BL(3), BL(7), BL(11), etc. for detection by the sense amplifiers.

Operation of the memory array 204 in connection with a soft programming of the NVM is as follows:

A soft programming of the memory is accomplished by driving all bit lines BL (odd and even) to ground. The first and second select lines sel_1(x) and sel_2(x) for the memory sector 308 being soft programmed are disabled (i.e., driven to ground) by the control circuit 400. Indeed, if the whole array 304 is being soft programmed, then the first and second select lines sel_1(x) and sel_2(x) for every memory sector 308 are disabled. The first and second dummy select lines dsel_1 and dsel_2 are enabled (driven to Vdd) by the control circuit 400 which turns on the transistors in all dummy cells 202 of both the first (or top) dummy sector 310t and the second (or bottom) dummy sector 310b. These dummy cells 202 will electrically connect all of the bit lines BL to the first through fourth source lines SL1 through SL4. These first through fourth source lines SL1 through SL4 are connected by the control circuit 400 to ground in response to operation of the memory in soft programming mode. With all bit lines BL now connected to ground, soft programming can be performed by driving the gate terminals of the memory cells MC to a high voltage sufficient to cause the soft programming operation. At the same time, the column decoder is disabled so that the bit lines BL do not interact with column decoding signals.

It is also possible to operate the memory array 204 in connection with performing a checker-board or inverse checker-board programming operation.

For the checker-board programming operation, the first and second select lines sel_1(x) and sel_2(x) for every memory sector 308 being programmed are disabled (i.e., driven to ground) by the control circuit 400. The first and second dummy select lines dsel_1 and dsel_2 are driven by the control circuit 400 to an inhibit voltage (generally a voltage which is a fraction (for example, ⅓) of the programming voltage for a memory cell MC. The first and fourth source lines SL1 and SL4 are connected by the control circuit 400 to ground in response to operation of the memory in checker-board programming mode, while the second and third source lines SL2 and SL3 are driven by the control circuit 400 to the inhibit voltage. As a result, odd numbered memory cells MC in the odd numbered memory rows are programmed to a first logic value (i.e., to logic 1), while the even numbered memory cells MC in the odd numbered memory rows are programmed to a second logic value (i.e., to logic 0), with the even numbered memory rows having the opposite programming. At the same time, the column decoder is disabled so that the bit lines BL do not interact with column decoding signals.

For the inverse checker-board programming operation, the first and second select lines sel_1(x) and sel_2(x) for every memory sector 308 being programmed are disabled (i.e., driven to ground) by the control circuit 400. The first and second dummy select lines dsel_1 and dsel_2 are driven by the control circuit 400 to a voltage of THH/3. The first and fourth source lines SL1 and SL4 are driven by the control circuit 400 to the voltage of THH/3 in response to operation of the memory in inverse checker-board programming mode, while the second and third source lines SL2 and SL3 are connected by the control circuit 400 to ground. As a result, even numbered memory cells MC in the odd numbered memory rows are programmed to a first logic value (i.e., to logic 1), while the odd numbered memory cells MC in the odd numbered memory rows are programmed to a second logic value (i.e., to logic 0), with the even numbered memory rows having the opposite programming. At the same time, the column decoder is disabled so that the bit lines BL do not interact with column decoding signals.

It is an advantage of the disclosed programming operation for the memory array 204 that checker-board or inverse checker-board programming operation can be accomplished without interfacing with or using any program load circuitry of the NVM. Rather, simple control over the voltages applied to the select lines and source lines will effectuate the desired memory cell programming for all sectors with a particular pattern.

A further operation of the memory array 204 can perform an erase operation. In erase mode, the first and second select lines sel_1(x) and sel_2(x) for every memory sector 308 being erased are driven to a fraction (for example, ⅔) of the erase voltage by the control circuit 400. The first and second dummy select lines dsel_1 and dsel_2 are driven by the control circuit 400 to that fraction of the erase voltage. The first through fourth source lines SL1 through SL4 are controlled by the control circuit 400 to either a) be floating or b) be connected to the same voltage which is biasing the bulk (for example, p-well) of the memory area; that bias voltage being, for example, the erase voltage. As a result, only the floating gate based memory cells MC will be exposed to the erase voltage, and remaining transistors are not stressed.

Figure 6A:
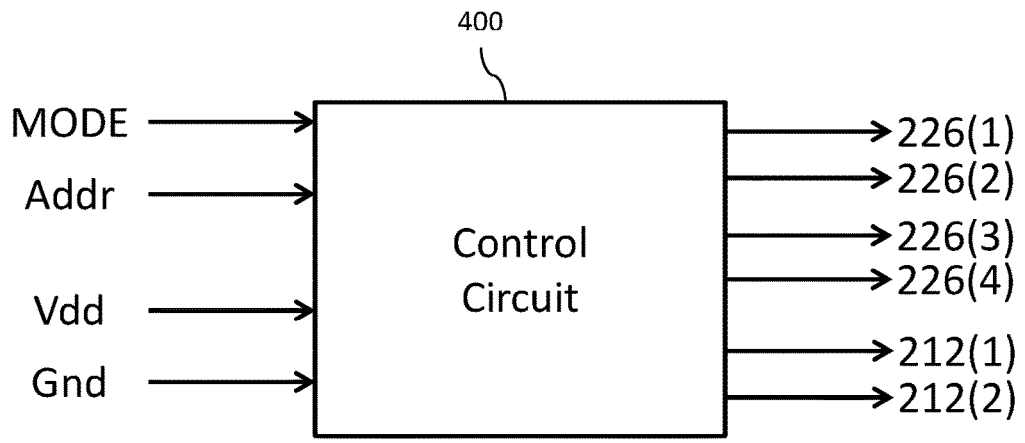
FIG. 6A-6B show a block diagram of a control circuit.
Figure 6B:
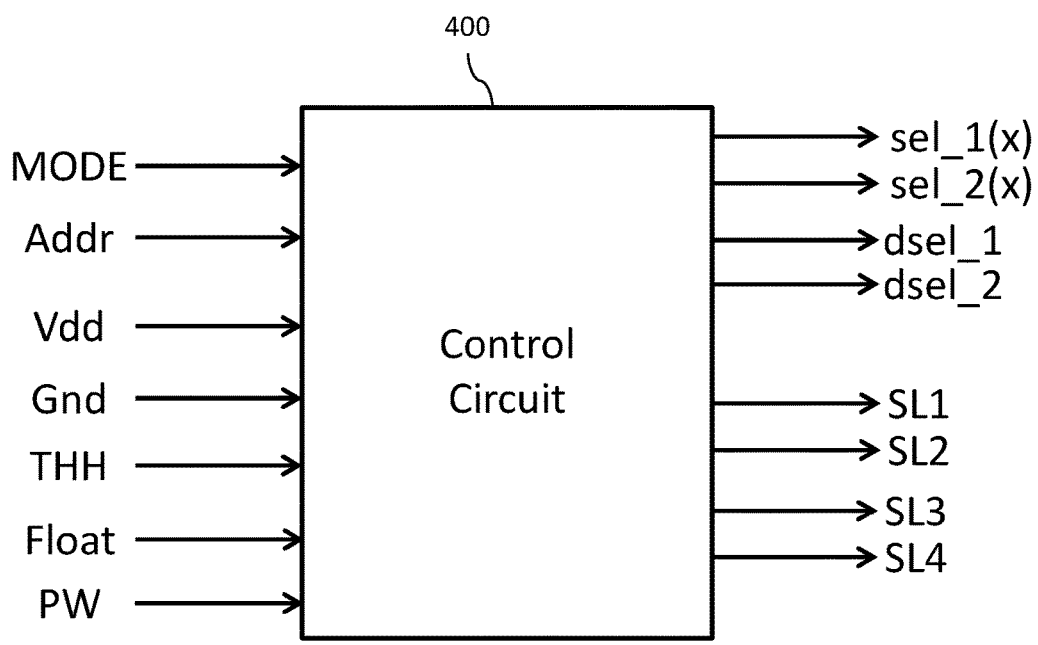

Reference is now made to FIGS. 6A-6B showing a block diagram of a control circuit 400. The control circuit 400 receives a mode signal (MODE) which identifies the operational mode of the NVM. For example, the mode signal MODE can specify whether the NVM memory is operating in read mode, soft-programming mode, checker-board programming mode, inverse checker-board programming mode, or erase mode. Responsive to the specified operating mode (as well as the designated memory address or a decoding of the designated memory address when in read mode; this information provided by an address signal (Addr)), the control circuit 400 generates the appropriate voltages for the first and second select lines sel_1(x) and sel_2(x) of each sector 308 (lines 226(1)-226(2) of FIG. 3), the first and second dummy select lines dsel_1 and dsel_2 (lines 226(3)-226(4) of FIG. 3), and the first through fourth source lines SL1 through SL4 (lines 212(1)-212(2) of FIG. 3). The control circuit 400 may be implemented as a part of the address decoder circuit or as a part of a row decoder in an implementation as generally indicated in FIG. 3, or could be provided separate and apart from any decoder circuitry.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column;
wherein the dummy portion comprises:
a first row of dummy cells, wherein dummy cells in the first row have a first connection to a corresponding bit line of a first bit line group of the plurality of bit lines and a second connection to a first source line; and
a second row of dummy cells, wherein dummy cells in the second row have a first connection to a corresponding bit line of a second bit line group of the plurality of bit lines and a second connection to a second source line;
wherein bit lines of the first bit line group are different from bit lines of the second bit line group.

2. The memory of claim 1, wherein bit lines of the first bit line group of the plurality of bit lines alternate with bit lines of the second bit line group of the plurality of bit lines.

3. The memory of claim 1, further comprising a control circuit configured to apply a selectable reference voltage to the first and second source lines depending on a memory operating mode.

4. The memory of claim 3, wherein the selectable reference voltage applied by the control circuit to both the first and second source lines are ground voltages when the memory is operating a read memory operating mode.

5. The memory of claim 4, further comprising:
a column decoder configured to selectively connect the first bit line group of the plurality of bit lines for reading from a first group of memory cells connected to bit lines of the first bit line group; and
said control circuit further configured to selectively actuate the dummy cells within the second row of dummy cells to connect the second bit line group of the plurality of bit lines to the ground voltage for application of the ground voltage to the first group of memory cells through the second bit line group of the plurality of bit lines.

6. The memory of claim 4, further comprising:
a column decoder configured to selectively connect the second bit line group of the plurality of bit lines for reading from a second group of memory cells connected to bit lines of the second bit line group; and
said control circuit further configured to selectively actuate the dummy cells within the first row of dummy cells to connect the first bit line group of the plurality of bit lines to the ground voltage for application of the ground voltage to the second group of memory cells through the first bit line group of the plurality of bit lines.

7. The memory of claim 3, wherein the selectable reference voltage applied by the control circuit to both the first and second source lines are ground voltages when the memory is operating a soft programming memory operating mode.

8. The memory of claim 7, further comprising:
a column decoder configured to selectively disconnect the plurality of bit lines from column decoding signals; and
said control circuit further configured to selectively actuate the dummy cells within the first and second rows of dummy cells to connect the first and second bit line groups of the plurality of bit lines to the ground voltage for application of the ground voltage to the memory cells of the memory portion of the memory array.

9. The memory of claim 3, wherein the selectable reference voltage applied by the control circuit to the first source line is a first programming voltage and the selectable reference voltage applied by the control circuit to the second source lines is a second programming voltage, different from the first programming voltage, when the memory is operating a pattern programming memory operating mode.

10. The memory of claim 9, further comprising:
a column decoder configured to selectively disconnect the plurality of bit lines from column decoding signals; and
said control circuit further configured to:
selectively actuate the dummy cells within the first row of dummy cells to connect the first bit line group of the plurality of bit lines to the first programming voltage for application of the first programming voltage to the memory cells connected to the first bit line group of the plurality of bit lines; and
selectively actuate the dummy cells within the second row of dummy cells to connect the second bit line group of the plurality of bit lines to the second programming voltage for application of the second programming voltage to the memory cells connected to the second bit line group of the plurality of bit lines.

11. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column and to the dummy portion;
a column decoder configured to selectively connect a first bit line group of the plurality of bit lines for reading from a first group of memory cells connected to bit lines of the first bit line group; and
a control circuit configured to selectively actuate dummy cells within the dummy portion of the memory array to connect a second bit line group of the plurality of bit lines to a read reference voltage for application of the read reference voltage to the first group of memory cells through the second bit line group of the plurality of bit lines;
wherein bit lines of the first bit line group are different from bit lines of the second bit line group.

12. The memory of claim 11, wherein the dummy portion comprises a first row of dummy cells including a first plurality of pairs of dummy cells, each pair of dummy cells in the first plurality of pairs of dummy cells having a common connection to a corresponding bit line of the first bit line group of the plurality of bit lines, and wherein adjacent pairs of dummy cells in the first plurality of pairs of dummy cells share a common connection to the read reference voltage.

13. The memory of claim 12:
the column decoder further configured to selectively connect the second bit line group of the plurality of bit lines for reading from a second group of memory cells connected to bit lines of the second bit line group; and
the control circuit further configured to selectively actuate dummy cells within the dummy portion of the memory array to connect the first bit line group of the plurality of bit lines to the read reference voltage for application of the read reference voltage to the second group of memory cells through the first bit line group of the plurality of bit lines.

14. The memory of claim 13, wherein the dummy portion comprises a second row of dummy cells including a second plurality of pairs of dummy cells, each pair of dummy cells in the second plurality of pairs of dummy cells having a common connection to a corresponding bit line of the second bit line group of the plurality of bit lines, and wherein adjacent pairs of dummy cells in the second plurality of pairs of dummy cells share a common connection to the read reference voltage.

15. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column and to the dummy portion;
a column decoder configured to selectively disconnect the plurality of bit lines from column decoding signals; and
a control circuit configured to selectively actuate dummy cells within the dummy portion of the memory array to connect the plurality of bit lines to a soft programming reference voltage for application of the soft programming reference voltage to the memory cells of the memory portion of the memory array;
wherein the dummy portion comprises:
a first row of dummy cells including a first plurality of pairs of dummy cells, each pair of dummy cells in the first plurality of pairs of dummy cells having a common connection to a corresponding bit line of a first bit line group of the plurality of bit lines, and wherein adjacent pairs of dummy cells in the first plurality of pairs of dummy cells share a common connection to the soft programming reference voltage; and
a second row of dummy cells including a second plurality of pairs of dummy cells, each pair of dummy cells in the second plurality of pairs of dummy cells having a common connection to a corresponding bit line of a second bit line group of the plurality of bit lines, and wherein adjacent pairs of dummy cells in the second plurality of pairs of dummy cells share a common connection to the soft programming reference voltage.

16. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column and to the dummy portion;
a column decoder configured to selectively disconnect a first bit line group of the plurality of bit lines and a second bit line group of the plurality of bit lines from column decoding signals; and
a control circuit configured to selectively actuate dummy cells within the dummy portion of the memory array to:
connect the first bit line group of the plurality of bit lines to a first programming voltage for application of the first programming voltage to a first group of memory cells connected to the first bit line group of the plurality of bit lines; and
simultaneously connect the second bit line group of the plurality of bit lines to a second programming voltage, different from the first programming voltage, for application of the second programming voltage to a second group of memory cells connected to the second bit line group of the plurality of bit lines.

17. The memory of claim 16, wherein the dummy portion comprises:

a first row of dummy cells including a first plurality of pairs of dummy cells, each pair of dummy cells in the first plurality of pairs of dummy cells having a common connection to a corresponding bit line of the first bit line group of the plurality of bit lines, and wherein adjacent pairs of dummy cells in the first plurality of pairs of dummy cells share a common connection to the first programming voltage; and a second row of dummy cells including a second plurality of pairs of dummy cells, each pair of dummy cells in the second plurality of pairs of dummy cells having a common connection to a corresponding bit line of the second bit line group of the plurality of bit lines, and wherein adjacent pairs of dummy cells in the second plurality of pairs of dummy cells share a common connection to the second programming voltage.

18. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column;
wherein the dummy portion comprises:
  a first row of dummy cells which includes a first plurality of pairs of dummy cells, each pair of dummy cells in the first plurality of pairs of dummy cells having a common connection to a corresponding bit line of a first bit line group of the plurality of bit lines, each dummy cell in each pair of dummy cells for the first row having a second connection to a first source line; and
  a second row of dummy cells which includes a second plurality of pairs of dummy cells, each pair of dummy cells in the second plurality of pairs of dummy cells having a common connection to a corresponding bit line of a second bit line group of the plurality of bit lines, each dummy cell in each pair of dummy cells for the second row having a second connection to a second source line.

19. The memory of claim 18, wherein bit lines of the first bit line group of the plurality of bit lines alternate with bit lines of the second bit line group of the plurality of bit lines.

20. The memory of claim 18, further comprising a control circuit configured to apply a selectable reference voltage to the first and second source lines depending on a memory operating mode.

21. The memory of claim 20, wherein the selectable reference voltage applied by the control circuit to both the first and second source lines is a ground voltage when the memory is operating a read memory operating mode.

22. The memory of claim 21, further comprising:
a column decoder configured to selectively connect the first bit line group of the plurality of bit lines for reading from a first group of memory cells connected to bit lines of the first bit line group; and
said control circuit further configured to selectively actuate the dummy cells within the second row of dummy cells to connect the second bit line group of the plurality of bit lines to the ground voltage for application of the ground voltage to the first group of memory cells through the second bit line group of the plurality of bit lines.

23. The memory of claim 21, further comprising:
a column decoder configured to selectively connect the second bit line group of the plurality of bit lines for reading from a second group of memory cells connected to bit lines of the second bit line group; and
said control circuit further configured to selectively actuate the dummy cells within the first row of dummy cells to connect the first bit line group of the plurality of bit lines to the ground voltage for application of the ground voltage to the second group of memory cells through the first bit line group of the plurality of bit lines.

24. The memory of claim 20, wherein the selectable reference voltage applied by the control circuit to both the first and second source lines is a ground voltage when the memory is operating a soft programming memory operating mode.

25. The memory of claim 24, further comprising:
a column decoder configured to selectively disconnect the plurality of bit lines from column decoding signals; and
said control circuit further configured to selectively actuate the dummy cells within the first and second rows of dummy cells to connect the first and second bit line groups of the plurality of bit lines to the ground voltage for application of the ground voltage to the memory cells of the memory portion of the memory array.

26. The memory of claim 20, wherein the selectable reference voltage applied by the control circuit to the first source line is a first programming voltage and the selectable reference voltage applied by the control circuit to the second source lines is a second programming voltage, different from the first programming voltage, when the memory is operating a pattern programming memory operating mode.

27. The memory of claim 26, further comprising:
a column decoder configured to selectively disconnect the plurality of bit lines from column decoding signals; and
said control circuit further configured to:
  selectively actuate the dummy cells within the first row of dummy cells to connect the first bit line group of the plurality of bit lines to the first programming voltage for application of the first programming voltage to the memory cells connected to the first bit line group of the plurality of bit lines; and
  selectively actuate the dummy cells within the second row of dummy cells to connect the second bit line group of the plurality of bit lines to the second programming voltage for application of the second programming voltage to the memory cells connected to the second bit line group of the plurality of bit lines.

28. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column and to the dummy portion;
a column decoder configured to selectively connect a first bit line group of the plurality of bit lines for reading from a first group of memory cells connected to bit lines of the first bit line group; and
a control circuit configured to selectively actuate dummy cells within the dummy portion of the memory array to connect a second bit line group of the plurality of bit lines to a read reference voltage for application of the read reference voltage to the first group of memory cells through the second bit line group of the plurality of bit lines;
wherein the dummy portion comprises a first row of dummy cells including a first plurality of pairs of dummy cells, each pair of dummy cells in the first plurality of pairs of dummy cells having a common connection to a corresponding bit line of the first bit line group of the plurality of bit lines, and wherein adjacent pairs of dummy cells in the first plurality of pairs of dummy cells share a common connection to the read reference voltage.

29. The memory of claim 28, wherein:
the column decoder is further configured to selectively connect the second bit line group of the plurality of bit lines for reading from a second group of memory cells connected to bit lines of the second bit line group; and
the control circuit is further configured to selectively actuate dummy cells within the dummy portion of the memory array to connect the first bit line group of the plurality of bit lines to the read reference voltage for application of the read reference voltage to the second group of memory cells through the first bit line group of the plurality of bit lines.

30. The memory of claim 29, wherein the dummy portion comprises a second row of dummy cells including a second plurality of pairs of dummy cells, each pair of dummy cells in the second plurality of pairs of dummy cells having a common connection to a corresponding bit line of the second bit line group of the plurality of bit lines, and wherein adjacent pairs of dummy cells in the second plurality of pairs of dummy cells share a common connection to the read reference voltage.

31. A memory, comprising:
a memory array including a plurality of rows and columns, the memory array including a memory portion including memory cells and a dummy portion including dummy cells;
a plurality of bit lines, one bit line for each column of the memory array, each bit line connected to the memory cells within the column and to the dummy portion;
a column decoder configured to selectively disconnect a first bit line group of the plurality of bit lines and a second bit line group of the plurality of bit lines from column decoding signals; and
a control circuit configured to selectively actuate dummy cells within the dummy portion of the memory array to:
connect the first bit line group of the plurality of bit lines to a first programming voltage for application of the first programming voltage to a first group of memory cells connected to the first bit line group of the plurality of bit lines; and
connect the second bit line group of the plurality of bit lines to a second programming voltage, different from the first programming voltage, for application of the second programming voltage to a second group of memory cells connected to the second bit line group of the plurality of bit lines;
wherein the dummy portion comprises:
a first row of dummy cells including a first plurality of pairs of dummy cells, each pair of dummy cells in the first plurality of pairs of dummy cells having a common connection to a corresponding bit line of the first bit line group of the plurality of bit lines, and wherein adjacent pairs of dummy cells in the first plurality of pairs of dummy cells share a common connection to the first programming voltage; and
a second row of dummy cells including a second plurality of pairs of dummy cells, each pair of dummy cells in the second plurality of pairs of dummy cells having a common connection to a corresponding bit line of the second bit line group of the plurality of bit lines, and wherein adjacent pairs of dummy cells in the second plurality of pairs of dummy cells share a common connection to the second programming voltage.

\* \* \* \* \*